(12) United States Patent
Shue et al.

(10) Patent No.: US 6,759,750 B2
(45) Date of Patent: Jul. 6, 2004

(54) METHOD FOR INTEGRATING LOW-K MATERIALS IN SEMICONDUCTOR FABRICATION

(75) Inventors: Shau-Lin Shue, Hsinchu (TW); Ming-Hsing Tsai, Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/623,910

(22) Filed: Jul. 18, 2003

(65) Prior Publication Data

US 2004/0017009 A1 Jan. 29, 2004

Related U.S. Application Data

(63) Continuation of application No. 09/557,395, filed on Apr. 24, 2000, now Pat. No. 6,610,592.

(51) Int. Cl.$^7$ .......................... H01L 23/48; H01L 23/52
(52) U.S. Cl. ..................... 257/758; 257/759; 257/760
(58) Field of Search ............................. 257/758, 759, 257/760

(56) References Cited

U.S. PATENT DOCUMENTS

| 5,110,712 A | 5/1992 | Kessler et al. ............... 430/312 |
| 5,602,423 A | 2/1997 | Jain ............................ 257/752 |
| 5,744,394 A | 4/1998 | Iguchi et al. ............... 438/276 |
| 5,827,776 A | 10/1998 | Bandyopadhyay et al. . 438/624 |
| 6,495,917 B1 * | 12/2002 | Ellis-Monaghan et al. .. 257/758 |
| 6,573,538 B2 * | 6/2003 | Motsiff et al. .............. 257/127 |

* cited by examiner

*Primary Examiner*—David Nelms
*Assistant Examiner*—Tu-Tu Ho
(74) *Attorney, Agent, or Firm*—George O. Saile; Stephen B. Ackerman

(57) ABSTRACT

A method for integrating low-K materials in semiconductor fabrication. The process begins by providing a semiconductor structure having a dielectric layer thereover, wherein the dielectric layer comprising an organic low-K material. The dielectric layer is patterned to form pillar openings. A pillar layer is deposited over the semiconductor structure; thereby filling the pillar openings with the pillar layer. The pillar layer is planarized to form pillars embedded in said dielectric layer. The pillar layer comprises a material having good thermal stability, good structural strength, and good bondability of spin coating back-end materials, improving the manufacturability of organic, low-K dielectrics in semiconductor fabrication. In one embodiment, the pillars are formed prior to forming dual damascene interlayer contacts. In another embodiment, pillars are formed simultaneously with interlayer contacts.

12 Claims, 4 Drawing Sheets

METHOD FOR INTEGRATING LOW-K MATERIALS IN SEMICONDUCTOR FABRICATION

This is a continuation of patent application Ser. No. 09/557,395. Filing date Apr. 24, 2000, now U.S. Pat. No. 6,610,592. A Method Integrating Low-K Materials in Semiconductor Fabrication, assigned to the same assignee as the present Invention.

BACKGROUND OF INVENTION

1) Field of the Invention

This invention relates generally to fabrication of a semiconductor device and more particularly to a method for forming a low-K dielectric layers with improved thermal stability and structural strength by forming pillars, comprising material with good thermal stability and structural strength within the low-K dielectric layer.

2) Description of the Prior Art

Integrated circuits continue to increase in complexity each year. As applications develop for memories, microprocessors, and minicomputers there is an increasing demand for greater microminiaturization. The shrinking design rule for ULSI circuits has led to increased interconnection delay caused by parasitic capacitance of interconnection wiring. One way to reduce the interconnection delay is to reduce the dielectric constant of the dielectric layer between the device layer and the interconnect layer, or the interlayer dielectric (ILD). A great deal of work has been aimed at developing organic polymers for use as interlayer dielectrics because their dielectric constants (K) are generally lower than those of inorganic materials. However, poor chemical stability, thermal stability and structural (mechanical) strength have hindered the widespread use of organic polymers as interlayer dielectrics in microelectronic fabrication.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,602,423 (Jain) shows damascene conductors with embedded pillars to prevent erosion during chemical-mechanical polishing.

U.S. Pat. No. 5,827,776 (Bandyopadhyay et al.) shows a multilevel interconnect structure using staggered interconnects to reduce electric field coupling between interconnect lines.

U.S. Pat. No. 5,110,712 (Kessler et al.) shows a metal interconnect in a polymer, low-K dielectric layer.

U.S. Pat. No. 5,744,394 (Iguchi et al.) shows a dual damascene process for forming interconnections.

However, none of these patents disclose or suggest combining a polymer, low-K dielectric layer with pillars comprising material with superior thermal stability and structural strength to overcome the processing limitations associated with using polymer, low-K dielectric layers.

SUMMARY OF THE INVENTION

It is an object of the present invention to provide a method for forming an organic, low-K dielectric layer having improved thermal stability.

It is another object of the present invention to provide a method for forming an organic, low-K dielectric layer having improved structural strength.

It is another object of the present invention to provide a method for forming an organic, low-K dielectric layer having improved bondability of spin coating back-end materials.

It is another object of the present invention to provide a method for forming an organic low-K dielectric layer with improved thermal stability, structural strength, and spin coating back-end material bondability by embedding pillars in the organic, low-K dielectric layer comprising a material with good thermal stability, structural strength, and bondability.

It is yet another object of the present invention to provide a producible and economical method for forming an organic, low-K dielectric layer in a semiconductor fabrication process.

To accomplish the above objectives, the present invention provides a method for integrating low-K materials in semiconductor fabrication. The process begins by providing a semiconductor structure having a dielectric layer thereover, wherein the dielectric layer comprising an organic low-K material. The dielectric layer is patterned to form pillar openings. A pillar layer is deposited over the semiconductor structure; thereby filling the pillar openings with the pillar layer. The pillar layer is planarized to form pillars embedded in said dielectric layer. The pillar layer comprises a material having good thermal stability, good structural strength, and good bondability of spin coating back-end materials, improving the manufacturability of organic, low-K dielectrics in semiconductor fabrication. In one embodiment, the pillars are formed prior to forming dual damascene interlayer contacts. In another embodiment, pillars are formed simultaneously with interlayer contacts.

The present invention provides considerable improvement over the prior art. Embedded pillars provide the thermal stability and structural strength necessary to make the use of organic, low-K dielectric layers practical, without reducing the dielectric properties of the organic, low-K dielectric layer. Also, the embedded pillars can provide good bondability of spin coating back-end materials.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming an organic, low-K dielectric layer having improved thermal stability and structural strength by embedding pillars in the organic, low-K dielectric layer, comprising a material having good thermal stability and structural strength.

First Embodiment

Figure 1:
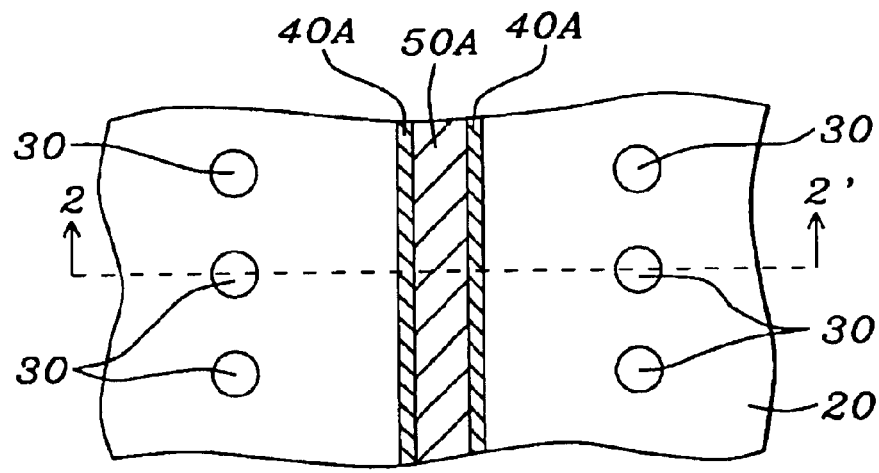
FIG. 1 shows a top view of a semiconductor device having an embedded pillar matrix formed within an organic, low-K dielectric layer according to a first embodiment of the present invention.

In a first embodiment of the present invention, as shown in FIGS. 1 through 6, pillars are formed in an organic, low-K dielectric layer prior to using a dual damascene process to form interconnects. As shown in FIG. 1, pillars (30) are embedded in an organic, low-K dielectric layer (20) between damascene contact structures (50A,40A). The damascene contact structures comprise a planarized contact (50A) and planarized underlying barrier layer.

Figure 2:
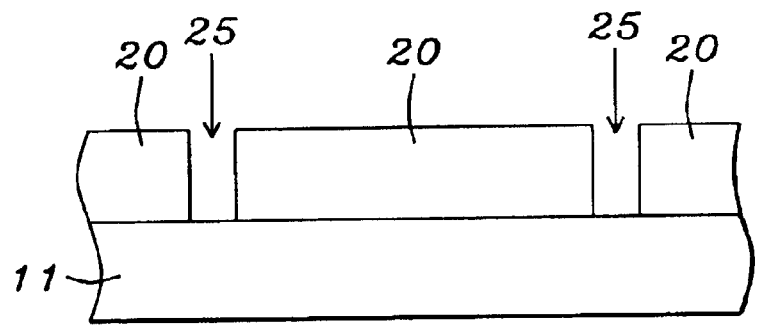
FIGS. 2 through 6 show sequential sectional views of a process for forming an organic, low-K dielectric layer with embedded pillars according to a first embodiment of the present invention. The cross-section for FIGS. 2 through 6 is taken generally along axis 2–2' shown on FIG. 1.

Referring to FIG. 2, the first embodiment of the present invention begins by providing a semiconductor structure (11) having a dielectric layer (20) thereover, wherein the dielectric layer comprises an organic, low-K dielectric material. Semiconductor structure (11) is understood to possibly include a substrate comprising a semiconducting material such as monocrystalline silicon or germanium or a silicon on insulator (SOI) structure as is known in the art. Semiconductor structure (11) is understood to possibly further include conductive layers and/or insulating layers formed over a substrate or the like, and passive and or active devices formed over and/or in the substrate or the like. The low-K dielectric layer (20) can comprise any of a number of advanced low-K materials including, but not limited to: aerogel, xerogel, nanoglass, Flare, amorphous $CF_x$, or Silk, JSR, Coral, and Black Diamond.

Still referring to FIG. 2, the low-K dielectric layer (20) is patterned to form pillar openings (25). The pillar openings can be formed using a lithography process and etch as is known in the art. The pillar openings (25) are preferably formed in a matrix pattern surrounding, but not over active areas of the semiconductor structure (11).

Figure 3:
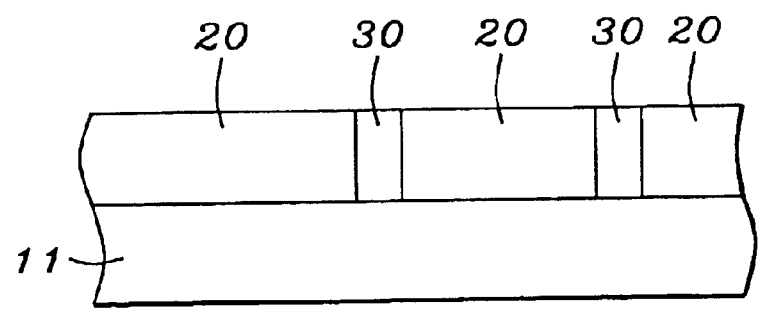

Referring to FIG. 3, a pillar layer is deposited over the semiconductor structure (11), filling the pillar openings (25). The pillar layer comprises a material having good thermal stability, good structural strength, and good bondability of spin coating back-end materials. Materials suitable for the pillar layer include, but are not limited to: silicon nitride, silicon carbide, carbon, amorphous carbon, tungsten, copper, and aluminum. The pillar layer can be deposited by various processes appropriate for the material chosen and known in the art, such as: chemical vapor deposition, sputtering, electroplating and most preferably C VD.

Still referring to FIG. 3, the pillar layer is planarized to form pillars (30), stopping on the low-K dielectric layer (20). The pillar layer is preferably planarized using a chemical-mechanical polishing process.

Figure 4:
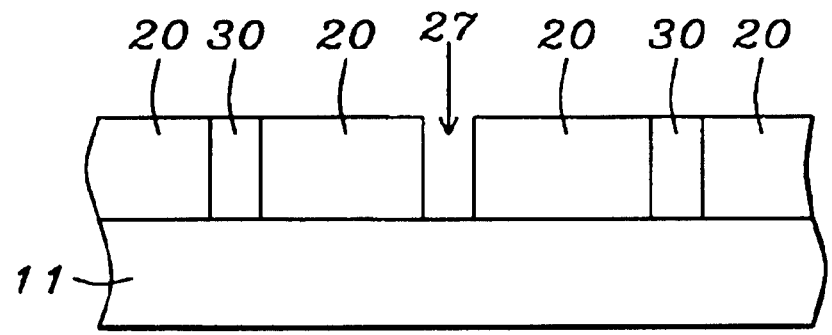

Referring to FIG. 4, the low-K dielectric layer (20) is patterned to form via openings (27). The via openings can be formed using a lithography process and etch as is known in the art. The via openings (27) are preferably formed over active areas of the semiconductor structure (11) to provide interconnections to interconnection layers.

Figure 5:
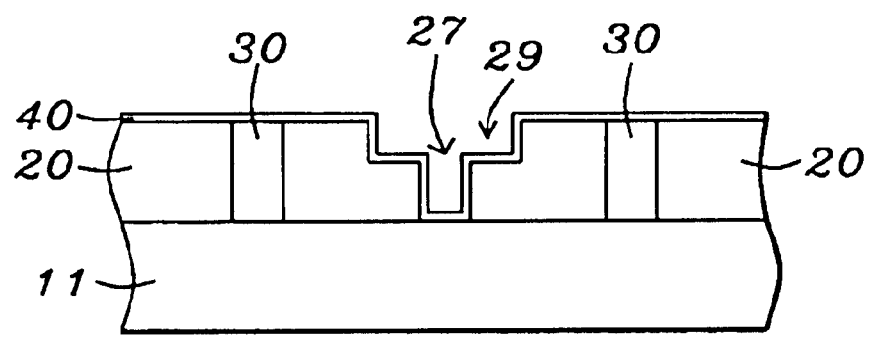

Referring to FIG. 5, the low-K dielectric layer (20) is patterned to form trench openings (29). The trench openings can be formed using a lithography process and etch as is known in the art. The trench openings (29) are formed over the via openings (27) such that they form interconnection patterns, connecting various via openings.

Still referring to FIG. 5, a barrier layer (40) is formed over the semiconductor structure (11) lining the bottoms and sidewalls of the via openings (27) and trench openings (29). The barrier layer preferably comprises tantalum nitride deposited using a sputtering process.

Figure 6:
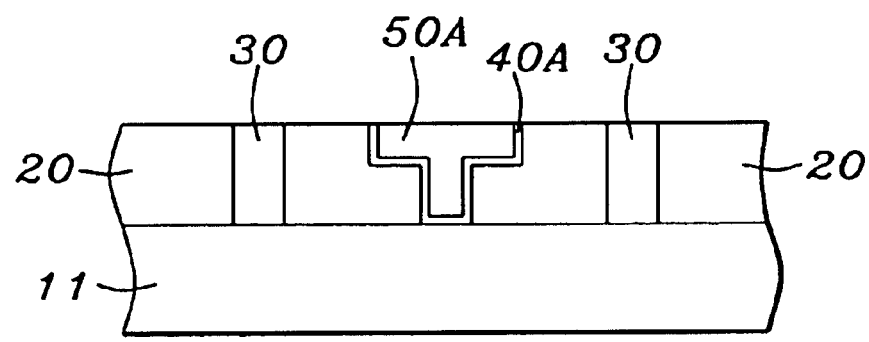

Referring to FIG. 6, an interconnect layer (50) is formed on the barrier layer (40). The interconnect layer preferably comprises copper deposited using a process such as electroplating, PVD, or CVD. The interconnect layer (50) and the barrier layer (40) are to planarized, stopping on the low-K dielectric layer (20) to form an interconnect (50A) with an underlying planaraized barrier layer (40A). The interconnect layer and the barrier layer are preferably planarized using a chemical-mechanical polishing process. The interconnect (50A) can be a dual damascene interconnect or can be a combination of an interconnect and a conductive line. Alternatively, the interconnect (50A) can be formed between two conductive lines (e.g. metal lines) or between the semiconductor structure (11) and an overlying conductive line (e.g. poly-1 and metal-1).

Second Embodiment

Figure 7:
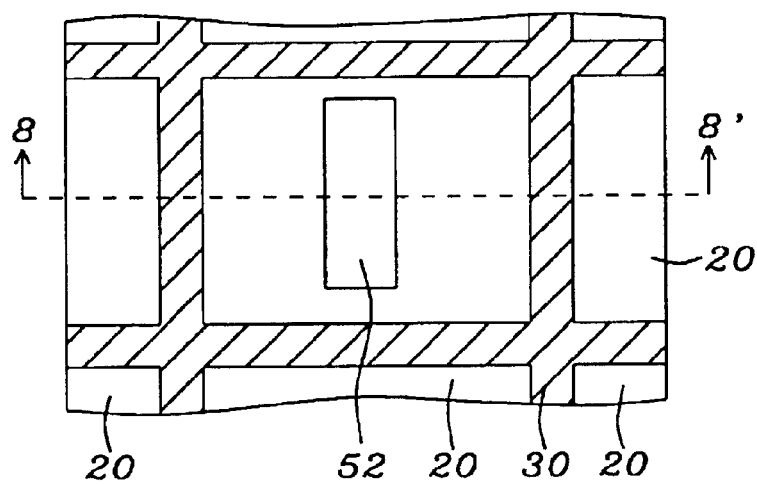
FIG. 7 shows a top view of a semiconductor device having an embedded pillar matrix formed within an organic, low-K dielectric layer according to a second embodiment of the present invention.

In a second embodiment of the present invention, as shown in FIGS. 7 through 11, pillars are formed in an organic, low-K dielectric layer simultaneously with formation of interlayer contacts for an interconnect layer. Referring to FIG. 7, pillars (30) are embedded in an organic, low-K dielectric layer (20) in a matrix pattern, surrounding an interconnect pattern (52) which overlies an active area of a semiconductor structure under the low-K dielectric layer.

Figure 8:
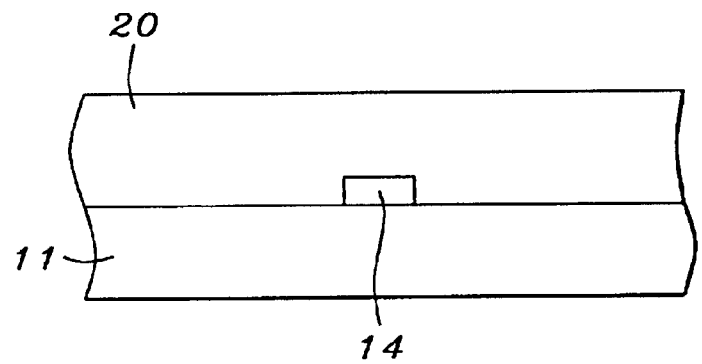
FIGS. 8 through 10 show sequential sectional views of a process for forming an organic, low-K dielectric layer with embedded pillars according to a second embodiment of the present invention. The cross-section for FIGS. 8 through 10 is taken generally along axis 8–8' shown on FIG. 7.

Referring to FIG. 8, the second embodiment of the present invention begins by providing a semiconductor structure (11) having a conductive structure (14) thereover. Semiconductor structure (11) is understood to possibly include a substrate comprising a semiconducting material such as monocrystalline silicon or germanium or a silicon on insulator (SOI) structure as is known in the art. Semiconductor structure (11) is understood to possibly further include conductive layers and/or insulating layers formed over a substrate or the like, and passive and or active devices formed over and/or in the substrate or the like. The conductive structure (14) can be any of several conductive structures known in the art, such as a gate, conductive line (e.g. metal line), a word line, or a bit line. The conductive structure (14) can be formed on the substrate, or on an ILD layer or an IMD layer overlying the substrate.

Still referring to FIG. 8, the semiconductor structure (11) and the conductive structure (14) have a dielectric layer (20) thereover, wherein the dielectric layer comprises an organic, low-K dielectric material. The low-K dielectric layer (20) can comprise any of a number of advanced low-K materials including, but not limited to: aerogel, xerogel, nanoglass, Flare, and amorphous $CF_x$.

Figure 9:
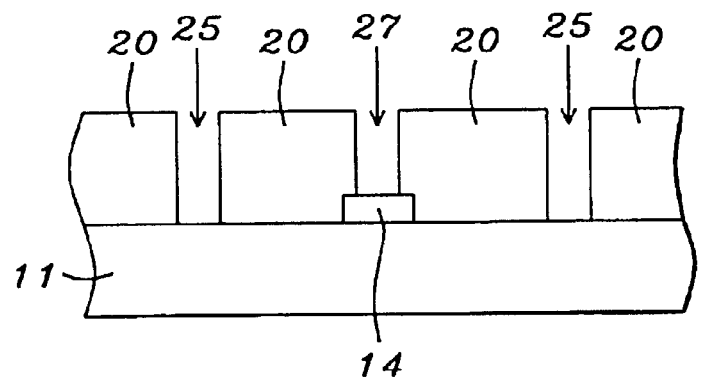

Referring to FIG. 9, the low-K dielectric layer (20) is patterned to form pillar openings (25) and via openings (27). The pillar openings and via openings can be formed using a lithography process and etch as is known in the art. The pillar openings (25) are preferably formed in a matrix pattern surrounding, but not over the conductive structures on the semiconductor structure (11). The via openings (27) are formed over the conductive structure (14).

Figure 10:
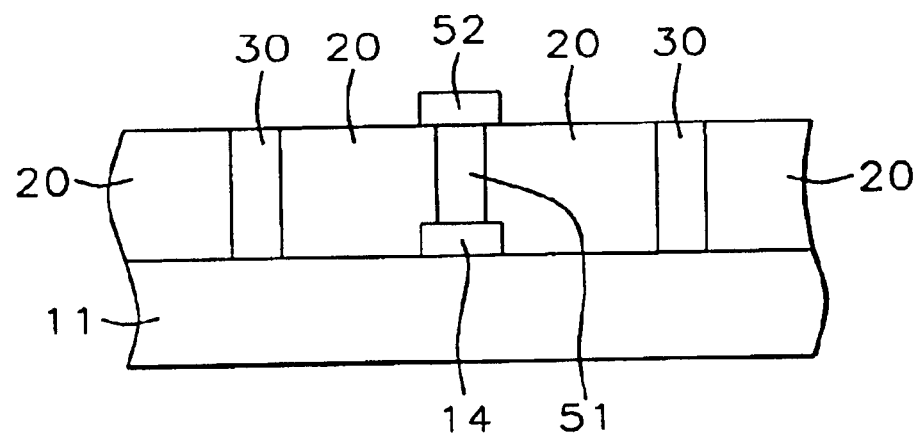

Referring to FIG. 10, a pillar and contact layer is deposited over the semiconductor structure (11), filling the pillar openings (25) and the via openings (27). The pillar and contact layer comprises a conductive material having good thermal stability, good structural strength, and good bondability of spin coating back-end materials. Materials suitable for the pillar and contact layer include, but are not limited to: tungsten, copper, and aluminum. The pillar and contact layer can be deposited by various processes appropriate for the material chosen and known in the art, such as: chemical vapor deposition, sputtering, electroplating and most preferably CVD.

Still referring to FIG. 10, the pillar and contact layer is planarized to form pillars (30) in the pillar openings and contacts (e.g. via plugs) (51) in the contact openings, stopping on the low-K dielectric layer (20). The pillar and contact layer is preferably planarized using a chemical-mechanical polishing process.

Still referring to FIG. 10, a interconnect pattern (52) is formed over the contacts (e.g. via plugs) (51), by depositing a conductive layer, then patterning the conductive layer to form an interconnect pattern. The conductive layer can be pattern using a lithography and etch process as is known in the art. The conductive layer preferably comprises a metal material suitable for semiconductor interconnects, such as copper or aluminum.

A key advantage of the present invention is that the embedded pillars provide the thermal stability and structural strength necessary to make the use of organic, low-K dielectric layers practical, without reducing the dielectric properties of the organic, low-K dielectric layer. Also, the embedded pillars can provide good bondability of spin coating back-end materials.

What is claimed is:

1. A Duel Damascene wiring structure, integrating low-K dielectrics, for use in semiconductor fabrication, comprising:

a semiconductor structure having a Surface containing conductive regions and insulating regions;

a dielectric layer overlaying the substrate and in contact with the conductive regions and the insulating regions; the dielectric layer having a planar top surface, the dielectric layer comprised of a single homogeneous low-K material, the low-K material having a dielectric constant of less than about 3.2;

a matrix of structural openings in the dielectric layer extending to the insulating regions; the structural openings containing a thermally conductive structural material in contact with the insulating regions and planar with the top surface of the dielectric layer, whereby a matrix of structural elements is embedded within the dielectric layer, plurally of via openings in the dielectric layer extending to the conductive regions, the via openings containing a conductive material in contact with the conductive regions and planar with the top surface of the dielectric layer; wherein a plurality of conductive vias provides electrical communication through the dielectric layer;

a plurality of interconnect openings in the top surface of the dielectric layer and extending partially through the dielectric layer, said interconnect openings extending along the surface of the dielectric layer and contacting at least one via opening, the interconnect openings containing the conductive material in contact with the conductive material in the via opening and planar with the top surface of the dielectric layer; wherein a plurality of conductive interconnects cooperating with the plurality of conductive vias provide electrical communication throughout the dielectric layer;

whereby a thermally and electrically communicative low-K dielectric structural layer is provided for semiconductor fabrication.

2. The Dual Damascene wiring structure of claim 1, wherein the low-K dielectric material comprises a material selected from the group composed of: aerogel, xerogel, nanogel, Flare, amphoric Cfx, JSR, Coral and Black Diamond.

3. The Dual Damascene wiring structure of claim 1, wherein the thermally conductive structural material comprises a material selected from the group composed of: silicon nitride, silicon carbide, amorphous carbon, carbon, tungsten, copper and aluminum.

4. The Dual Damascene wiring structure of claim 1, wherein the conductive material comprises a material selected from the group composed of: tungsten, copper and aluminum.

5. The Dual Damascene wiring structure of claim 1, wherein a conformal barrier layer lining the via openings and the interconnect openings separates the low-K dielectric from the materials within the openings, said barrier layer comprising tantalum nitride.

6. The Dual Damascene wiring structure of claim 1, wherein the top surface of the dielectric providing insulating region and having planar conductive interconnects and vias forming conductive regions, the wiring structure is capable of replication.

7. A Single Damascene wiring structure, integrating low-K dielectrics, for use in semiconductor fabrication, comprising:

a semiconductor structure having a surface containing conductive regions and insulating regions, the conductive regions further comprising a first plurality of conductive interconnects atop the surface;

a dielectric layer overlaying the substrate and in contact with the conductive regions and the insulating regions; the dielectric layer having a planar top surface, the dielectric layer comprised of a single homogeneous low-K material, the low-K material having a dielectric constant of less than about 3.2;

a matrix of structural openings in the dielectric layer extending to the insulating regions; the structural openings containing a thermally conductive structural material in contact with the insulating regions and planar with the top surface of the dielectric layer, whereby a matrix of structural elements is embedded within the dielectric layer, a plurality of via openings in the dielectric layer extending to the conductive regions, the via openings containing a conductive material in contact with the conductive regions and planar with the top surface of the dielectric layer; wherein a plurality of conductive vias provides electrical communication through the dielectric layer;

a second plurality of interconnects formed from the conductive material overlaying the top surface of the dielectric layer, extending along the surface of the dielectric layer and contacting at least one conductive via, wherein the plurality of conductive interconnects cooperating with the plurality of conductive vias provide electrical communication throughout the dielectric layer;

whereby a thermally and electrically communicative low-K dielectric structural layer is provided for semiconductor fabrication.

8. The Single Damascene wiring structure of claim 7, wherein the low-K dielectric material comprise a material selected from the group composed of: aerogel, xerogel, nanogel, Flare, amphoric Cfx, JSR, Coral and Black Diamond.

9. The Single Damascene wiring structure of claim 7, wherein the thermally conductive structural material comprises a material selected from the group composed of: silicon nitride, silicon carbide, amorphous carbon, carbon, tungsten, copper and aluminum.

10. The Single Damascene wiring structure of claim 7, wherein a conformal barrier layer lining the via openings and the interconnect openings separates the low-K dielectric and the materials within the openings, said barrier layer comprising tantalum nitride.

11. The Single Damascene wiring structure of claim 7, wherein a conformal barrier layer lining the via openings separates the low-K dielectric from the materials within the openings, said barrier layer comprising tantalum nitride.

12. The Single Damascene wiring structure of claim 7, wherein the top surface of the dielectric providing insulating regions and having conductive interconnects and planar vias forming conductive regions, the wiring structure is capable of replication.

* * * * *